United States Patent
Zhang et al.

(10) Patent No.: US 10,447,507 B1
(45) Date of Patent: Oct. 15, 2019

(54) LOW SUPPLY LINEAR EQUALIZER WITH PROGRAMMABLE PEAKING GAIN

(71) Applicant: NXP B.V., Eindhoven (NL)

(72) Inventors: Xu Zhang, Chandler, AZ (US);
Soon-Gil Jung, Cupertino, CA (US);
Ahmad Yazdi, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/172,591

(22) Filed: Oct. 26, 2018

(51) Int. Cl.
*H03L 7/08* (2006.01)
*H04L 25/03* (2006.01)

(52) U.S. Cl.
CPC .. *H04L 25/03019* (2013.01); *H04L 25/03267* (2013.01); *H04L 25/03885* (2013.01); *H03L 7/0807* (2013.01)

(58) Field of Classification Search
USPC .......................... 375/232, 229; 327/559, 563
See application file for complete search history.

(56) References Cited

U.S. PATENT DOCUMENTS

| | | | |
|---|---|---|---|
| 8,222,967 B1* | 7/2012 | Raman | H03F 3/193 333/28 R |
| 8,274,326 B2* | 9/2012 | Boecker | H03F 1/301 327/559 |
| 9,288,085 B2* | 3/2016 | Bulzacchelli | H04L 25/03057 |
| 9,325,319 B1* | 4/2016 | Mishra | H03K 19/094 |
| 9,509,281 B1* | 11/2016 | Francese | H03H 11/48 |
| 10,075,141 B1* | 9/2018 | Nagulapalli | H03F 3/193 |

OTHER PUBLICATIONS

Blateanu, Andreea et al. "A Cable Equalizer with 31 dB of Adjustable Peaking at 52 GHz", IEEE Bipolar/BiCMOS Circuits and Technology Meeting, 2009; pp. 154-157.
Zhang, Guangyu Evelina et al. "A 10 Gb/s BiCMOS Adaptive Cable Equalizer", IEEE Journal of Solid-State Circuits, vol. 40, No. 11, Nov. 2005; pp. 2132-2140.
Liu, Hao et al. "An HDMI Cable Equalizer With Self-Generated Energy Ratio Adaptation Scheme", IEEE Transactions on Circuits and Systems—II: Express Briefs, vol. 56, No. 7, Jul. 2009; pp. 595-599.
A. Balteanu, S.P. Voinigescu, E.S. Rogers SR., "A cable equalizer with 31 dB of adjustable peaking at 52 GHz", IEEE Bipolar/BiCMOS Circuits and Technology Meeting, p. 154-7, 2009.

(Continued)

*Primary Examiner* — Eva Y Puente (57) ABSTRACT

Embodiments of linear equalizers are disclosed. In an embodiment, a linear equalizer includes sets of transistors, a resistor, and first and second impedance elements. The sets of transistors are connected between at least one input terminal of the linear equalizer and at least one output terminal of the linear equalizer. The resistor is connected to a supply voltage, to the at least one output terminal, and to the sets of transistors. The first and second impedance elements are connected between emitter terminals or source terminals of the sets of transistors and at least one fixed voltage. A peaking gain of the linear equalizer is programmable by adjusting a direct current (DC) component of at least one input signal that is received at the at least one input terminal and that is applied to the sets of transistors.

20 Claims, 3 Drawing Sheets

(56) References Cited

OTHER PUBLICATIONS

G.E. Zhang, M.M. Green, "A 10 Gb/s BiCMOS Adaptive Cable Equalizer", IEEE Journal of Solid-State Circuits, vol. 40, No. 11, 2005.

H. Liu, L Mohammed, Y. Fan, M. Morgan, J. Liu, "An HDMI Cable Equalizer With Self-Generated Energy Ratio Adaptation Scheme", IEEE Transactions on Circuits and Systems—II: Express Briefs, vol. 56, No. 7, 2009.

* cited by examiner

LOW SUPPLY LINEAR EQUALIZER WITH PROGRAMMABLE PEAKING GAIN

BACKGROUND

A linear equalizer can be used to reduce or eliminate inter symbol interference (ISI) in an incoming signal without having a feedback path from an output of the linear equalizer. Traditional architectures of linear equalizers with programmable peaking gain typically include stacked or cascode transistors that have relatively large power consumption due to higher supply voltage. Because of the relatively large power consumption, said architectures are not ideal for many applications with limited budget.

SUMMARY

Embodiments of linear equalizers are disclosed. In an embodiment, a linear equalizer includes sets of transistors, a resistor, and first and second impedance elements. The sets of transistors are connected between at least one input terminal of the linear equalizer and at least one output terminal of the linear equalizer. The resistor is connected to a supply voltage, to the at least one output terminal, and to the sets of transistors. The first and second impedance elements are connected between emitter terminals or source terminals of the sets of transistors and at least one fixed voltage. A peaking gain of the linear equalizer is programmable by adjusting a direct current (DC) component of at least one input signal that is received at the at least one input terminal and that is applied to the sets of transistors. Other embodiments are also described.

In an embodiment, each set of transistors of the sets of transistors have the same transconductance, and gate terminals or base terminals of transistors in each set of transistors are connected together.

In an embodiment, the peaking gain of the linear equalizer is programmable by adjusting the DC component of the at least one input signal such that the transconductance of at least one set of transistors of the sets of transistors is changed.

In an embodiment, each transistor of the sets of transistors is a bipolar junction transistor (BJT), and the first and second impedance elements are connected between the emitter terminals of the sets of transistors and the at least one fixed voltage.

In an embodiment, the at least one input signal is applied to base terminals of the sets of transistors.

In an embodiment, each transistor of the sets of transistors is a field-effect transistor (FET), and the first and second impedance elements are connected between the source terminals of the sets of transistors and the at least one fixed voltage.

In an embodiment, the at least one input signal is applied to gate terminals of the sets of transistors.

In an embodiment, the first impedance element comprises a second resistor, and the second impedance element comprises a third resistor, an inductor, and a capacitor.

In an embodiment, the third resistor is connected in parallel with the inductor and the capacitor.

In an embodiment, the at least one fixed voltage is physical ground or alternating current (AC) ground.

In an embodiment, a linear equalizer system comprises the linear equalizer and a DC bias generator configured to generate the DC component of the at least one input signal.

In an embodiment, the DC bias generator comprises a plurality of adjustable current sources whose current levels are adjusted in order to change the DC component of the at least one input signal.

In an embodiment, a linear equalizer includes a first set of transistors and a second set of transistors connected between two input terminals of the linear equalizer and an output terminal of the linear equalizer, a resistor connected to a supply voltage, to the output terminal, and to the first and second sets of transistors, and first and second impedance elements connected between emitter terminals or source terminals of the first and second sets of transistors and at least one fixed voltage. The first set of transistors has a first transconductance, and wherein the second set of transistors has a second transconductance. A peaking gain of the linear equalizer is programmable by adjusting a DC component of an input signal that is received at the two input terminals and that is applied to the first and second sets of transistors.

In an embodiment, the first transconductance is different from the second transconductance, and gate terminals or base terminals of transistors in each of the first and second sets of transistors are connected together.

In an embodiment, the peaking gain of the linear equalizer is programmable by adjusting the DC component of the at least one input signal such that the first transconductance of the first set of transistors or the second transconductance of the second set of transistors is changed.

In an embodiment, each transistor of the first and second sets of transistors is a BJT. The first and second impedance elements are connected between the emitter terminals of the first and second sets of transistors and the at least one fixed voltage. The at least one input signal is applied to base terminals of the first and second sets of transistors.

In an embodiment, each transistor of the first and second sets of transistors is a FET. The first and second impedance elements are connected between the source terminals of the first and second sets of transistors and the at least one fixed voltage. The at least one input signal is applied to gate terminals of the first and second sets of transistors.

In an embodiment, the first impedance element comprises a second resistor. The second impedance element comprises a third resistor, an inductor, and a capacitor. The third resistor is connected in parallel with the inductor and the capacitor between the emitter terminals or the source terminals of the sets of transistors and the at least one fixed voltage.

In an embodiment, a linear equalizer system comprises the linear equalizer and a DC bias generator, which comprises a plurality of adjustable current sources whose current levels are adjusted in order to change the DC component of the at least one input signal.

In an embodiment, a differential linear equalizer includes first, second, third, and fourth sets of transistors connected between four input terminals of the differential linear equalizer and two output terminals of the differential linear equalizer, two resistors connected to a supply voltage, to the two output terminals, and to the first, second, third, and fourth sets of transistors, and first and second impedance elements connected between emitter terminals or source terminals of the first, second, third, and fourth sets of transistors and at least one fixed voltage. The first and third sets of transistors have a first transconductance. The second and fourth sets of transistors have a second transconductance. A peaking gain of the differential linear equalizer is programmable by adjusting a DC component of the two input signals that are received at the fourth input terminals and that are applied to the first, second, third, and fourth sets of transistors.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
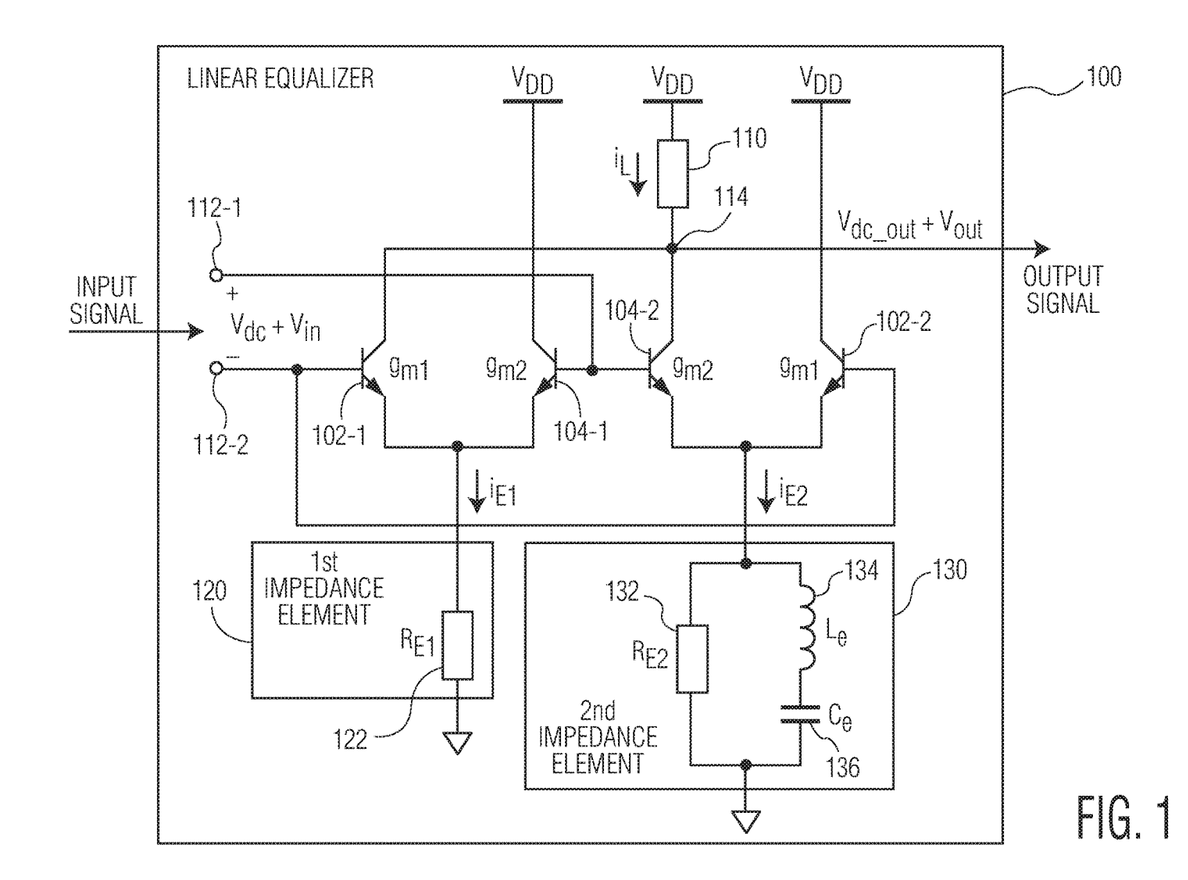
FIG. 1 is a schematic block diagram of a linear equalizer in accordance with an embodiment of the invention.

FIG. 1 is a schematic block diagram of a linear equalizer 100 in accordance with an embodiment of the invention. In the embodiment depicted in FIG. 1, the linear equalizer includes a first set of transistors 102-1, 102-2, a second set of transistors 104-1, 104-2, a resistor 110 with a resistance value, "$R_L$," and first and second impedance elements 120, 130. The linear equalizer can be used in various applications. In some embodiments, the linear equalizer is used in a Universal Serial Bus (USB) system, a DisplayPort (DP) system, a PCIe (Peripheral Component Interconnect Express) system, a Thunderbolt system, or another communications system. Although the illustrated linear equalizer is shown with certain components and described with certain functionality herein, other embodiments of the linear equalizer may include fewer or more components to implement the same, less, or more functionality. The linear equalizer depicted in FIG. 1 uses transistors that are all electrically connected between a supply voltage, $V_{DD}$, and a fixed voltage (e.g., ground) and does not include multiple transistors that are electrically stacked between the supply voltage, $V_{DD}$, and the fixed voltage. Consequently, compared to a linear equalizer that includes stacked transistors, the linear equalizer depicted in FIG. 1 can be used in low supply voltage applications.

In the embodiment depicted in FIG. 1, the linear equalizer 100 receives an input signal, $V_{dc}+V_{in}$, at the input terminals 112-1, 112-2, and outputs an output signal at an output terminal 114. The input signal includes a direct current (DC) component or bias, $V_{dc}$, and an input data signal component, $V_{in}$, which may be, for example, a high speed input signal component. The DC component, $V_{dc}$, of the input signal has both positive and negative polarities. In an embodiment, the extremes of positive and negative polarities are set by the maximum available current passing through the first and second set of transistors 102-1, 102-2, 104-1, 104-2. In the embodiment depicted in FIG. 1, the peaking gain of the linear equalizer (i.e., the highest amplitude of the gain curve of the linear equalizer) is programmable by adjusting the DC component, $V_{dc}$ that is received at input terminals 112-1, 112-2 of the linear equalizer and that is applied to the first and second sets of transistors. The output signal includes a DC component or bias, $V_{dc\_out}$, and an output data signal component, $V_{out}$. In some embodiments, the linear equalizer is included in a continuous-time linear equalizer system that can attenuate low-frequency signal components of the input signal, $V_{dc}+V_{in}$, amplify components of the input signal, $V_{dc}+V_{in}$, around the Nyquist frequency, and filter off higher frequencies of the input signal, $V_{dc}+V_{in}$.

In the embodiment depicted in FIG. 1, the first set of transistors 102-1, 102-2 and the second set of transistors 104-1, 104-2 of the linear equalizer 100 are connected between the input terminals 112-1, 112-2 of the linear equalizer and the output terminal 114 of the linear equalizer. The transistors 104-1, 102-2 are connected to the supply voltage, "$V_{DD}$," while the transistors 102-1, 104-2 are connected to the output terminal of the linear equalizer. In the embodiment depicted in FIG. 1, each set of transistors has the same transconductance. Specifically, the first set of the transistors 102-1, 102-2 have a transconductance of $g_{m1}$ while the second set of the transistors 104-1, 104-2 have a transconductance of $g_{m2}$. In some embodiments, transistors in each set of transistors have the same structures or are the same. In an embodiment, transistors in each set of transistors have the same type, have the same design specifications, have the same dimensions, and are made from the same substrate material with the same processing technology. For example, transistors in each set of transistors are made in bulk with an identical model number. In some embodiments, the transconductance, $g_{m1}$, is equivalent to the transconductance, $g_{m2}$. In the embodiment depicted in FIG. 1, gate terminals or base terminals of transistors in each set of transistors are connected together. Specifically, gate terminals or base terminals of the first set of transistors 102-1, 102-2 are connected together and are connected to the input terminal 112-2 while gate terminals or base terminals of the second set of transistors 104-1, 104-2 are connected together and are connected to the input terminal 112-1. In the embodiment depicted in FIG. 1, the peaking gain of the linear equalizer is programmable by adjusting the DC component, $V_{dc}$, of the input signal such that the transconductance of at least one of the first and second sets of transistors is changed.

In the embodiment depicted in FIG. 1, the resistor 110 is electrically connected to the supply voltage, $V_{DD}$, to the output terminal 114, and to the transistors 102-1, 104-2. The first and second impedance elements 120, 130 are electrically connected between the first and second sets of transistors and at least one fixed voltage (e.g., the ground). The first and second impedance elements may be electrically connected between emitter terminals or source terminals of the first and second sets of transistors and the fixed voltage (e.g., the ground). For example, with respect to FIG. 1, if the first and second sets of transistors are implemented as bipolar junction transistors (BJTs), the first and second impedance elements are electrically connected between the emitter terminals of the first and second sets of transistors and the fixed voltage (e.g., the ground). In another example, with respect to FIG. 1, if the first and second sets of transistors are implemented as field-effect transistors (FETs), the first and second impedance elements are electrically connected between the source terminals of the first and second sets of transistors and the ground. In the embodiment depicted in FIG. 1, the first impedance element 120 is implemented as a resistor 122 with a resistance value of $R_{E1}$, while the second impedance element 130 includes a resistor 132 with a resistance value of $R_{E2}$, an inductor 134 with an inductance value of $L_e$, and a capacitor 136 with a capacitance value of $C_e$. In the embodiment depicted in FIG. 1, the resistor 132 is electrically connected in parallel with the inductor 134 and the capacitor 136 between the emitter terminals or the source terminals of the first and second sets of transistors and ground. In some embodiments, the resistance value, $R_{E1}$, of the resistor 122 may be equivalent to the resistance value, $R_{E2}$, of the resistor 132 to keep the low frequency independent of the peaking gain selection.

In the embodiment depicted in FIG. 1, the linear equalizer 100 has two parallel signal paths. One signal path, which is referred as the "flat gain path," has no or low peaking gain, and sets the low frequency gain for the linear equalizer. The flat gain path is associated with the resistor 122 and the first set of transistors 102-1, 102-2. The other signal path, which is referred as the "gain peaking path," provides the peaking gain for the linear equalizer. The gain peaking path is associated with the second impedance element 130 and the second set of transistors 104-1, 104-2. Through a weighted summation of the two signal paths, the peaking gain of the linear equalizer is programmable from 0 dB or flat band gain from the flat gain path to a maximum peaking gain from the gain peaking path. The weights of the flat gain path and the gain peaking path are adjusted by varying the transconductance, $g_{m1}$, and $g_{m2}$, of the transistors 102-1, 102-2, 104-1, 104-2 via controlling the DC component, $V_{dc}$, of the input signal applied at base terminals or gate terminals of the transistors 102-1, 102-2, 104-1, 104-2. For example, with respect to FIG. 1, if the transistors 102-1, 102-2, 104-1, 104-2 are implemented as bipolar junction transistors (BJTs), the weights of the flat gain path and the gain peaking path are adjusted by varying the transconductance, $g_{m1}$, and $g_{m2}$, of the transistors 102-1, 102-2, 104-1, 104-2 via controlling the DC component, $V_{dc}$, the input signal applied at base terminals of the transistors 102-1, 102-2, 104-1, 104-2. In another example, with respect to FIG. 1, if the transistors 102-1, 102-2, 104-1, 104-2 are implemented as field-effect transistors (FETs), the weights of the flat gain path and the gain peaking path are adjusted by varying the transconductance, $g_{m1}$, and $g_{m2}$, of the transistors 102-1, 102-2, 104-1, 104-2 via controlling the DC component, $V_{dc}$, of the input signal applied at gate terminals of the transistors 102-1, 102-2, 104-1, 104-2.

In an example operation of the linear equalizer 100 depicted in FIG. 1, when the DC component, $V_{dc}$, of the input signal is at its positive extreme (i.e., has the highest positive value), the first set of transistors 102-1, 102-2 is turned off and the current, $i_L$, through the resistor, $R_L$, is equivalent to the current, $i_{E2}$, through the second impedance element 130 (e.g., having identical magnitude and waveform as the current, $i_{E2}$). Consequently, the output current at the output terminal 114 is the current from the gain peaking path and the maximum peaking gain is observed at the output terminal. When the DC component, $V_{dc}$, of the input signal is at its negative extreme (i.e., has the highest negative value), the second set of transistors 104-1, 104-2 is turned off and the current, $i_L$, through the resistor, $R_L$, is equivalent to the current, $i_{E1}$, through the resistor 122. Consequently, the output current at the output terminal is the current from the flat band path and the minimum peaking gain is observed at the output terminal. The signal gain of the linear equalizer 100 can be expressed as:

$$\frac{v_{out}}{v_{in}} = \frac{g_{m1}R_L}{1+(g_{m1}+g_{m2})R_{E1}} + \frac{g_{m2}R_L}{1+(g_{m1}+g_{m2})Z_{E2}} \quad (1)$$

where $Z_{E2}$ represents the impedance value of the second impedance element 130, $R_L$ represents the resistance value of the resistor 110, and $R_{E1}$ represents the resistance value of the resistor 122. A weighted summation is performed in the current domain by the first and second set of transistors and is converted back to the voltage domain through the resistor 110. The transistor transconductance is proportional to the bias current, and therefore, the sum of transconductance, $g_{m1}$ and $g_{m2}$, of the first and second set of transistors is a constant. Consequently, when $R_{E1}$ is equal to $Z_{E2}$ in value at low frequency, the linear equalizer has a constant low frequency gain, which is independent of the peaking gain.

Figure 2:
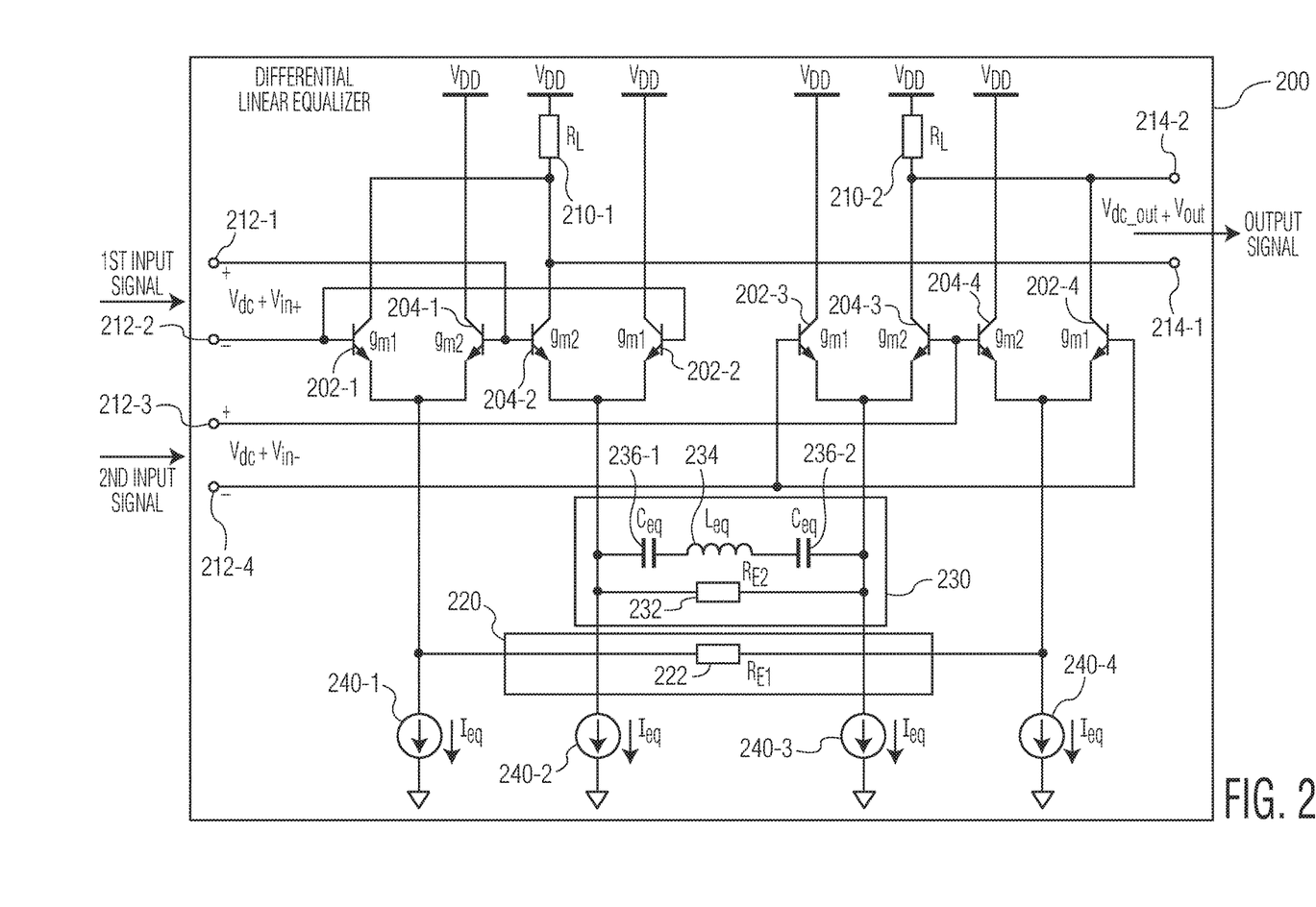
FIG. 2 is a schematic block diagram of a differential linear equalizer in accordance with an embodiment of the invention.

FIG. 2 is a schematic block diagram of a differential linear equalizer 200 in accordance with an embodiment of the invention. In the embodiment depicted in FIG. 2, the differential linear equalizer includes a first set of transistors 202-1, 202-2, a second set of transistors 204-1, 204-2, a third set of transistors 202-3, 202-4, a fourth set of transistors 204-3, 204-4, two resistors 210-1, 210-2, and first and second impedance elements 220, 230. The peaking gain of the differential linear equalizer is programmable by adjusting the DC component, $V_{dc}$, of first and second input signals, $V_{dc}+V_{in+}$, $V_{dc}+V_{in-}$, that are received at input terminals 212-1, 212-2, 212-3, 212-4 of the differential linear equalizer and that are applied to the first, second, third, and fourth sets of transistors 202-1, 202-2, 204-1, 204-2, 202-3, 202-3, 204-3, 204-4. The differential linear equalizer can be used in a USB system, a DP system, a PCIe system, a Thunderbolt system, or other communications system. Although the illustrated differential linear equalizer is shown with certain components and described with certain functionality herein, other embodiments of the differential linear equalizer may include fewer or more components to implement the same, less, or more functionality. The differential linear equalizer depicted in FIG. 2 uses transistors that are all electrically connected between a supply voltage, $V_{DD}$, and a fixed voltage (e.g., ground) and does not include multiple transistors that are electrically stacked between the supply voltage, $V_{DD}$, and the fixed voltage. Consequently, compared to a linear equalizer that includes stacked transistors, the differential linear equalizer depicted in FIG. 2 can be used in low supply voltage applications.

In the embodiment depicted in FIG. 2, the differential linear equalizer 200 receives the first and second input signals, $V_{dc}+V_{in+}$, $V_{dc}+V_{in-}$, at the input terminals 212-1, 212-2, 212-3, 212-4 and outputs an output signal at output terminals 214-1, 214-2. Each of the first and second input signals includes the DC component, $V_{dc}$, and an input data signal component, $V_{in+}$, or $V_{in-}$, which may be, for example, a high speed input signal component. For the differential implementation depicted in FIG. 2, the DC components between input terminals 212-1 to 212-2 and between input terminals 212-3 to 212-4 have the same value and are both marked as $V_{dc}$. In addition, $V_{in+}$, and $V_{in-}$ are equal in value but in opposite polarity to maintain the symmetry of a differential implementation. The DC component, $V_{dc}$, of the input signals has both positive and negative polarities. In an embodiment, the extremes of positive and negative polarities are set by the maximum available current passing through the four sets of transistors 202-1, 202-2, 202-3, 202-4, 204-1, 204-2, 204-3, 204-4. The DC component, $V_{dc}$, of the input signals also serves as a peaking gain control voltage for the linear equalizer as explained below. The output signal includes a DC component or bias, $V_{dc\_out}$, and an output data signal component, $V_{out}$.

In the embodiment depicted in FIG. 2, a first set of transistors 202-1, 202-2 and a second set of transistors 204-1, 204-2 of the differential linear equalizer 200 are electrically connected between the input terminals 212-1, 212-2 and the output terminal 214-1 of the linear equalizer. A third set of transistors 202-3, 202-4 and a fourth set of transistors 204-3, 204-4 of the differential linear equalizer are connected between the input terminals 212-3, 212-4 and the output terminal 214-2 of the linear equalizer of the differential linear equalizer. The transistors 204-1, 202-2, 202-3, 204-4 are connected to the supply voltage, "$V_{DD}$," while the transistors 202-1, 204-2, 204-3, 202-4 are connected to the output terminals 2014-1, 214-2 of the differential linear equalizer. In the embodiment depicted in FIG. 2, each set of transistors has the same transconductance. Specifically, the first set of the transistors 202-1, 202-2 and the third set of the transistors 202-3, 202-4 have a transconductance of $g_{m1}$ while the second set of the transistors 204-1, 204-2 and the fourth set of the transistors 204-3, 204-4 have a transconductance of $g_{m2}$. In some embodiments, transistors in each set of transistors have the same structures or are identical to each other. In an embodiment, transistors in each set of transistors have the same type, have the same design specifications, have the same dimensions, and are made from the same substrate material with the same processing technology. For example, transistors in each set of transistors are made in bulk with an identical model number. In some embodiments, the transconductance, $g_{m1}$, is equivalent to the transconductance, $g_{m2}$. In the embodiment depicted in FIG. 2, gate terminals or base terminals of transistors in each set of transistors are connected together. Specifically, gate terminals or base terminals of the first set of transistors 202-1, 202-2 are connected together and are connected to the input terminal 212-2, gate terminals or base terminals of the second set of transistors 204-1, 204-2 are connected together and are connected to the input terminal 212-1, gate terminals or base terminals of the third set of transistors 202-3, 202-4 are connected together and are connected to the input terminal 212-4, and gate terminals or base terminals of the fourth set of transistors 204-3, 204-4 are connected together and are connected to the input terminal 212-3. In the embodiment depicted in FIG. 2, the peaking gain of the differential linear equalizer is programmable by adjusting the DC component, $V_{dc}$, of the first and second input signals such that the transconductance of at least two of the first, second, third, and fourth sets of transistors is changed.

In the embodiment depicted in FIG. 2, the resistor 210-1 is electrically connected to the supply voltage, $V_{DD}$, to the output terminal 214-1, and to the first and second sets of transistors 202-1, 202-2, 204-1, 204-2, while the resistor 210-2 is electrically connected to the supply voltage, $V_{DD}$, to the output terminal 214-2, and to the third and fourth sets of transistors 202-3, 202-4, 204-3, 204-4. The first and second impedance elements may be electrically connected between emitter terminals or source terminals of the first, second, third, and fourth sets of transistors 202-1, 202-2, 202-3, 202-4, 204-1, 204-2, 204-3, 204-4 and a fixed voltage (e.g., the AC ground), either directly or indirectly. The first and second impedance elements imply virtual AC ground connections in the symmetry center of the component as other differential circuits. In some embodiments, the first, second, third, and fourth sets of transistors 202-1, 202-2, 202-3, 202-4, 204-1, 204-2, 204-3, 204-4 are electrically connected to the ground through current sources 240-1, 240-2, 240-3, 240-4. For example, with respect to FIG. 2, if the first, second, third, and fourth sets of transistors are implemented as bipolar junction transistors (BJTs), the first and second impedance elements are electrically connected between the emitter terminals of the first, second, third, and fourth sets of transistors and the fixed voltage (e.g., the ground). In another example, with respect to FIG. 2, if the first, second, third, and fourth sets of transistors are implemented as field-effect transistors (FETs), the first and second impedance elements are electrically connected between the source terminals of the first, second, third, and fourth sets of transistors. In the embodiment depicted in FIG. 2, the first impedance element 220 is implemented as a resistor 222 with a resistance value of $R_{E1}$, while the second impedance element 230 includes a resistor 232 with a resistance value of $R_{E2}$, an inductor 234 with an inductance value of $L_{eq}$, and two capacitors 236-1, 236-2 with a capacitance value of $C_{eq}$. In some embodiments, the resistance value, $R_{E1}$, of the resistor 222 may be equivalent to the resistance value, $R_{E2}$, of the resistor 232.

In the embodiment depicted in FIG. 2, the differential linear equalizer 200 has two parallel signal paths. One signal path, which is referred as the "flat gain path," has no or low peaking gain, and sets the low frequency gain for the differential linear equalizer. The flat gain path is associated with the resistor 222 and the first and third sets of transistors 202-1, 202-2, 202-3, 202-4. The other signal path, which is referred as the "gain peaking path," provides the gain peaking for the differential linear equalizer. The gain peaking path is associated with the second impedance element 230 and the second and fourth sets of transistors 204-1, 204-2, 204-3, 204-4. The weights of the flat gain path and the gain peaking path are adjusted by varying the transconductance, $g_{m1}$, and $g_{m2}$, of the transistors 202-1, 202-2, 202-3, 202-4, 204-1, 204-2, 204-3, 204-4 via controlling the DC component, $V_{dc}$, of the input signals applied at base terminals or gate terminals of the transistors 202-1, 202-2, 202-3, 202-4, 204-1, 204-2, 204-3, 204-4.

Figure 3:
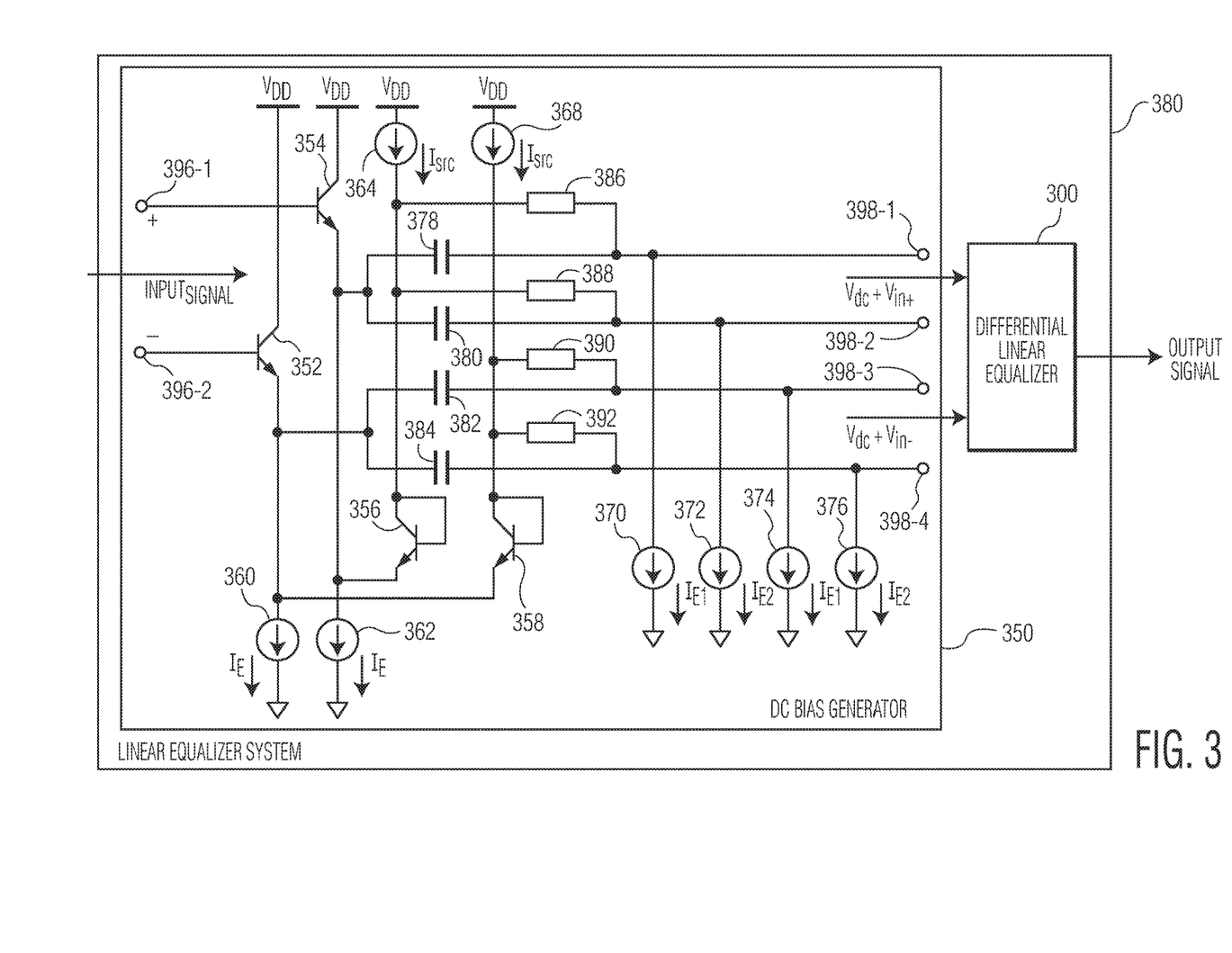
FIG. 3 depicts an embodiment of a linear equalizer system that includes a differential linear equalizer and a DC bias generator that can be used to provide DC bias to the differential linear equalizer.

FIG. 3 depicts an embodiment of a linear equalizer system 380 that includes a differential linear equalizer 300 and a DC bias generator 350 that can be used to provide DC bias to the differential linear equalizer. The differential linear equalizer 300 depicted in FIG. 3 is an embodiment of the differential linear equalizer 200 depicted in FIG. 2. The linear equalizer system may be implemented as an Integrated Circuit (IC device), which is manufactured on a substrate. Examples of the substrate include, without being limited to, silicon wafer and printed circuit board. In the embodiment depicted in FIG. 3, the DC bias generator includes transistors 352, 354, 356, 358, current sources 360, 362, 364, 368, 370, 372, 374, 376, capacitors 378, 380, 382, 384, and resistors 386, 388, 390, 392. In some embodiments, the transistors 352, 354, and the current sources 364, 368 are electrically connected to a supply voltage, VDD, while the current sources 360, 362, 370, 372, 374, 376 are electrically connected to a fixed voltage (e.g., the ground). The DC bias generator generates output signals, $V_{dc}+V_{in+}$, $V_{dc}+V_{in-}$, at output terminals 398-1, 398-2, 398-3, 398-4 based on an input signal received at input terminals 396-1, 396-2. In an embodiment, the DC bias generator operates as a high speed input buffer to feed the differential linear equalizer in which a high speed signal passes through an emitter follower and is coupled to the differential equalizer input through the capacitors. The DC bias necessary for equalizer peaking gain selection can be generated by varying the current levels $I_{E1}$ and $I_{E2}$ of the current sources 370, 372, 374, 376.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A linear equalizer, the linear equalizer comprising:
   sets of transistors connected between at least one input terminal of the linear equalizer and at least one output terminal of the linear equalizer;
   a resistor connected to a supply voltage, to the at least one output terminal, and to the sets of transistors; and
   first and second impedance elements connected between emitter terminals or source terminals of the sets of transistors and at least one fixed voltage, wherein a peaking gain of the linear equalizer is programmable by adjusting a direct current (DC) component of at least one input signal that is received at the at least one input terminal and that is applied to the sets of transistors.

2. The linear equalizer of claim 1, wherein each set of transistors of the sets of transistors have the same transconductance, and wherein gate terminals or base terminals of transistors in each set of transistors are connected together.

3. The linear equalizer of claim 2, wherein the peaking gain of the linear equalizer is programmable by adjusting the DC component of the at least one input signal such that the transconductance of at least one set of transistors of the sets of transistors is changed.

4. The linear equalizer of claim 1, wherein each transistor of the sets of transistors is a bipolar junction transistor (BJT), and wherein the first and second impedance elements are connected between the emitter terminals of the sets of transistors and the at least one fixed voltage.

5. The linear equalizer of claim 4, wherein the at least one input signal is applied to base terminals of the sets of transistors.

6. The linear equalizer of claim 1, wherein each transistor of the sets of transistors is a field-effect transistor (FET), and wherein the first and second impedance elements are connected between the source terminals of the sets of transistors and the at least one fixed voltage.

7. The linear equalizer of claim 6, wherein the at least one input signal is applied to gate terminals of the sets of transistors.

8. The linear equalizer of claim 1, wherein the first impedance element comprises a second resistor, and wherein the second impedance element comprises a third resistor, an inductor, and a capacitor.

9. The linear equalizer of claim 8, wherein the third resistor is connected in parallel with the inductor and the capacitor.

10. The linear equalizer of claim 9, wherein the at least one fixed voltage is physical ground or alternating current (AC) ground.

11. A linear equalizer system, wherein the linear equalizer system comprises the linear equalizer of claim 1 and a DC bias generator configured to generate the DC component of the at least one input signal.

12. The linear equalizer system of claim 11, wherein the DC bias generator comprises a plurality of adjustable current sources whose current levels are adjusted in order to change the DC component of the at least one input signal.

13. A linear equalizer, the linear equalizer comprising:
    a first set of transistors and a second set of transistors connected between two input terminals of the linear equalizer and an output terminal of the linear equalizer, wherein the first set of transistors has a first transconductance, and wherein the second set of transistors has a second transconductance;
    a resistor connected to a supply voltage, to the output terminal, and to the first and second sets of transistors; and
    first and second impedance elements connected between emitter terminals or source terminals of the first and second sets of transistors and at least one fixed voltage, wherein a peaking gain of the linear equalizer is programmable by adjusting a direct current (DC) component of an input signal that is received at the two input terminals and that is applied to the first and second sets of transistors.

14. The linear equalizer of claim 13, wherein the first transconductance is different from the second transconductance, and wherein gate terminals or base terminals of transistors in each of the first and second sets of transistors are connected together.

15. The linear equalizer of claim 14, wherein the peaking gain of the linear equalizer is programmable by adjusting the DC component of the at least one input signal such that the first transconductance of the first set of transistors or the second transconductance of the second set of transistors is changed.

16. The linear equalizer of claim 13, wherein each transistor of the first and second sets of transistors is a bipolar junction transistor (BJT), wherein the first and second impedance elements are connected between the emitter terminals of the first and second sets of transistors and the at least one fixed voltage, and wherein the at least one input signal is applied to base terminals of the first and second sets of transistors.

17. The linear equalizer of claim 13, wherein each transistor of the first and second sets of transistors is a field-effect transistor (FET), wherein the first and second impedance elements are connected between the source terminals of the first and second sets of transistors and the at least one fixed voltage, and wherein the at least one input signal is applied to gate terminals of the first and second sets of transistors.

18. The linear equalizer of claim 13, wherein the first impedance element comprises a second resistor, wherein the second impedance element comprises a third resistor, an inductor, and a capacitor, and wherein the third resistor is connected in parallel with the inductor and the capacitor between the emitter terminals or the source terminals of the sets of transistors and the at least one fixed voltage.

19. A linear equalizer system, wherein the linear equalizer system comprises the linear equalizer of claim 13 and a DC bias generator, which comprises a plurality of adjustable current sources whose current levels are adjusted in order to change the DC component of the at least one input signal.

20. A differential linear equalizer, the differential linear equalizer comprising:
   first, second, third, and fourth sets of transistors connected between four input terminals of the differential linear equalizer and two output terminals of the differential linear equalizer, wherein the first and third sets of transistors have a first transconductance, and wherein the second and fourth sets of transistors have a second transconductance;
   two resistors connected to a supply voltage, to the two output terminals, and to the first, second, third, and fourth sets of transistors; and
   first and second impedance elements connected between emitter terminals or source terminals of the first, second, third, and fourth sets of transistors and at least one fixed voltage, wherein a peaking gain of the differential linear equalizer is programmable by adjusting a direct current (DC) component of the two input signals that are received at the fourth input terminals and that are applied to the first, second, third, and fourth sets of transistors.

* * * * *